United States Patent [19]

Harward et al.

[11] Patent Number: 5,287,304
[45] Date of Patent: Feb. 15, 1994

[54] MEMORY CELL CIRCUIT AND ARRAY

[75] Inventors: Mark G. Harward, Dallas; Shivaling S. Mahant-Shetti, Richardson; Howard Tigelaar, Allen, all of Tex.

[73] Assignee: Texas Instruments Incorporated, Dallas, Tex.

[21] Appl. No.: 636,518

[22] Filed: Dec. 31, 1990

[51] Int. Cl.⁵ ............................................. G11C 13/00
[52] U.S. Cl. ......................... 365/189.01; 365/189.09; 365/233
[58] Field of Search ............... 365/189.01, 189.05, 365/189.07, 189.09, 233

[56] References Cited

U.S. PATENT DOCUMENTS

| | | | |
|---|---|---|---|
| 3,611,317 | 10/1971 | Bonfeld | 340/173 |
| 3,638,202 | 1/1972 | Schroeder | 340/173 |
| 4,184,208 | 1/1980 | Tubbs | 365/203 |
| 4,646,271 | 2/1987 | Uchiyama | 365/49 |

OTHER PUBLICATIONS

IBM Technical Disclosure Bulletin, vol. 22, No. 3, Aug. 1979, "Single V-Groove High Density Static Random-Access Memory Cell", by S. E. Schuster, pp. 1282-1283.

Primary Examiner—Terrell W. Fears
Attorney, Agent, or Firm—Peter T. Rutkowski; Richard L. Donaldson; William E. Hiller

[57] ABSTRACT

An improved memory cell (118) is provided which may be incorporated into an array (202) of memory cells. Array (202) includes a first gate conductor region (224) and a second gate conductor region (238), wherein the first and second gate conductor regions are orthogonal to one another. Each one-half of the cell may include two series transistors connected to a cross-coupled trench transistor. Cross-coupling of the trench transistors is effected through the use of parallel local interconnect regions (256) and (258).

12 Claims, 9 Drawing Sheets

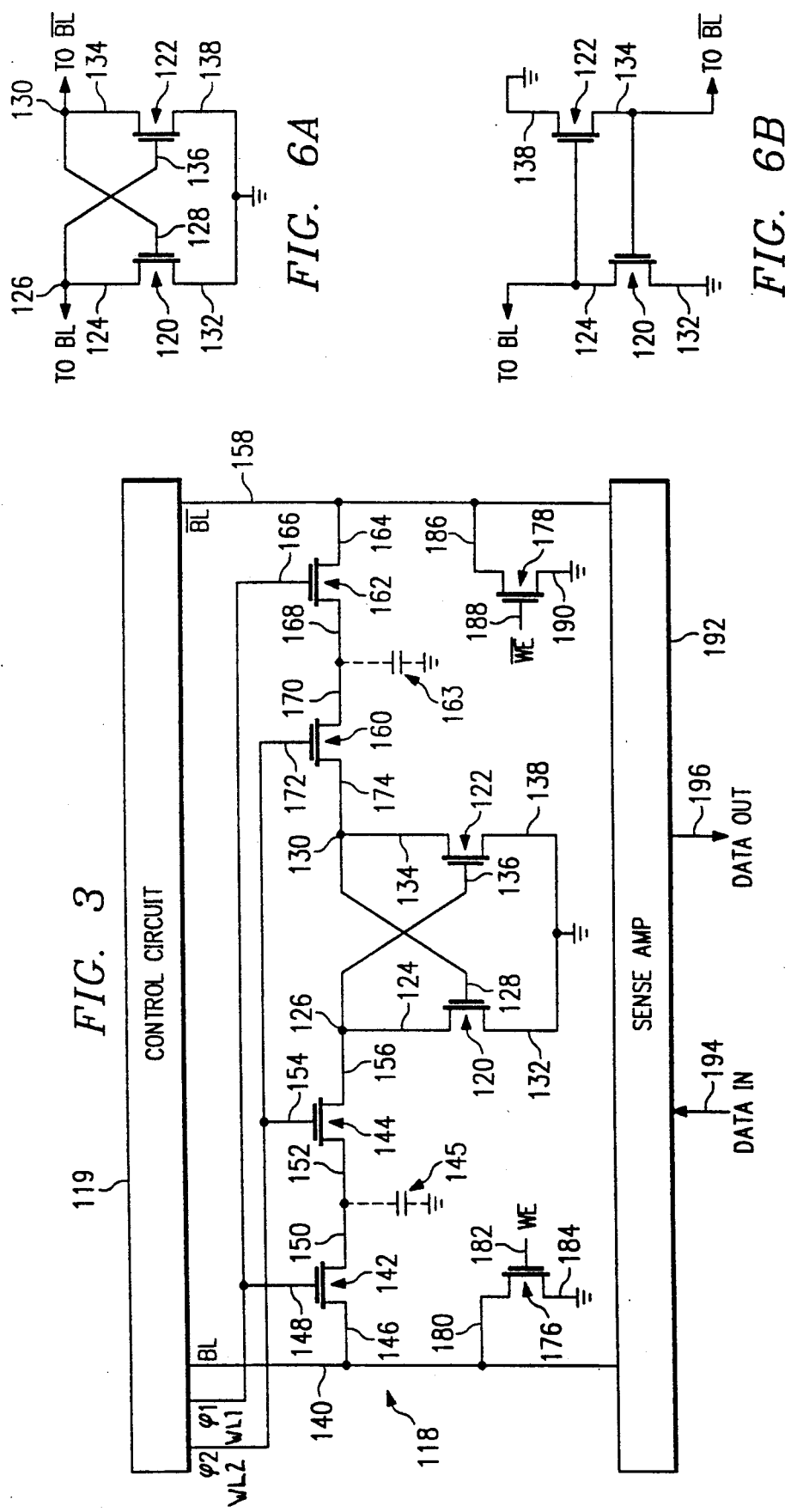

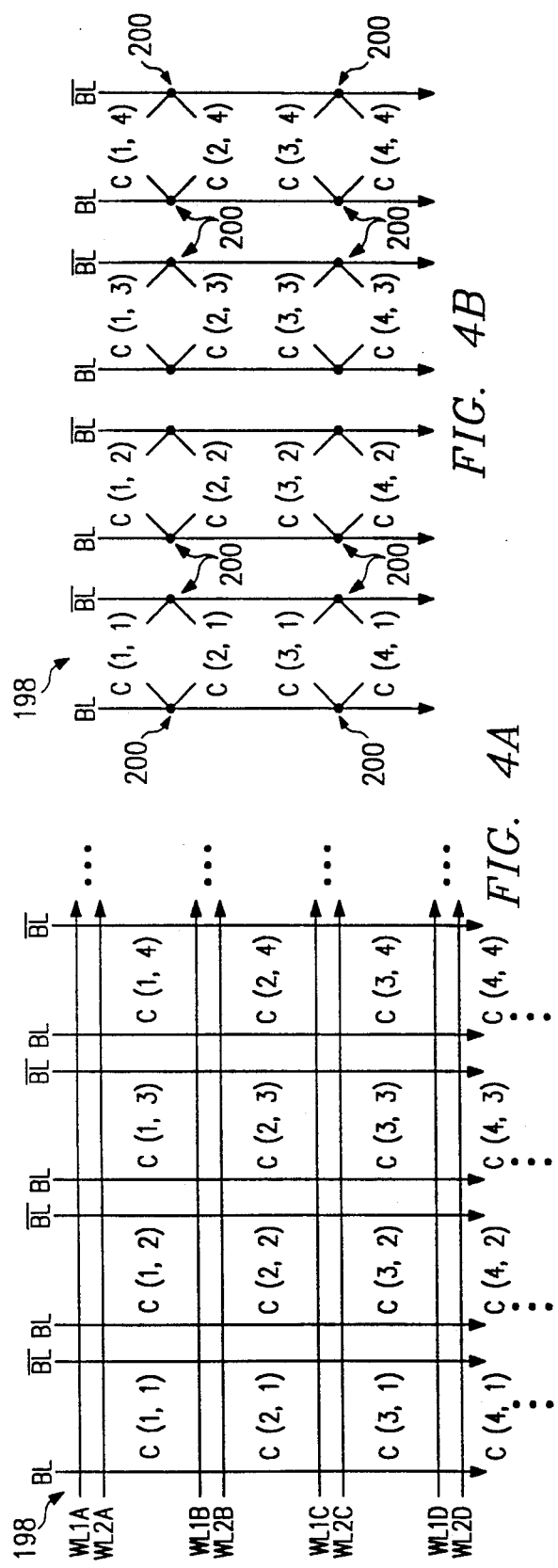
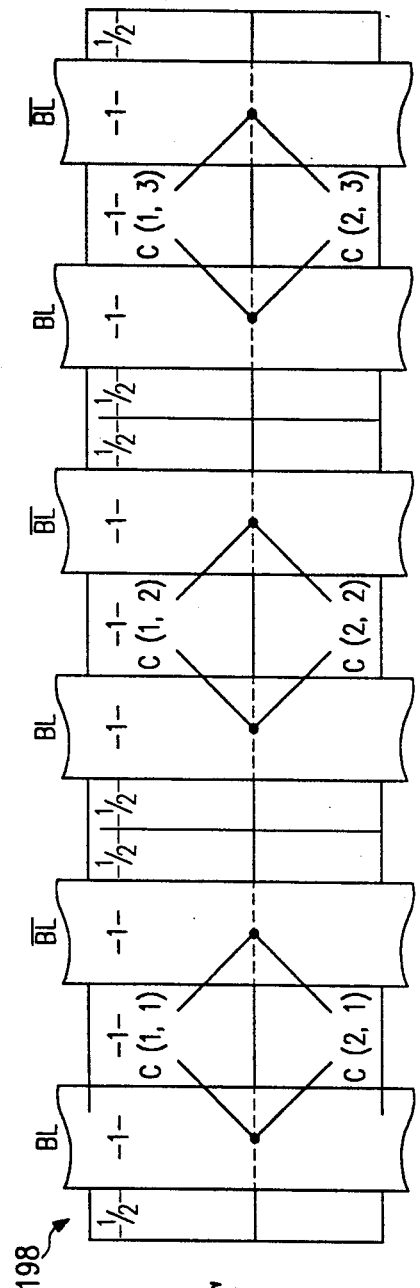
FIG. 4A
FIG. 4B
FIG. 4C

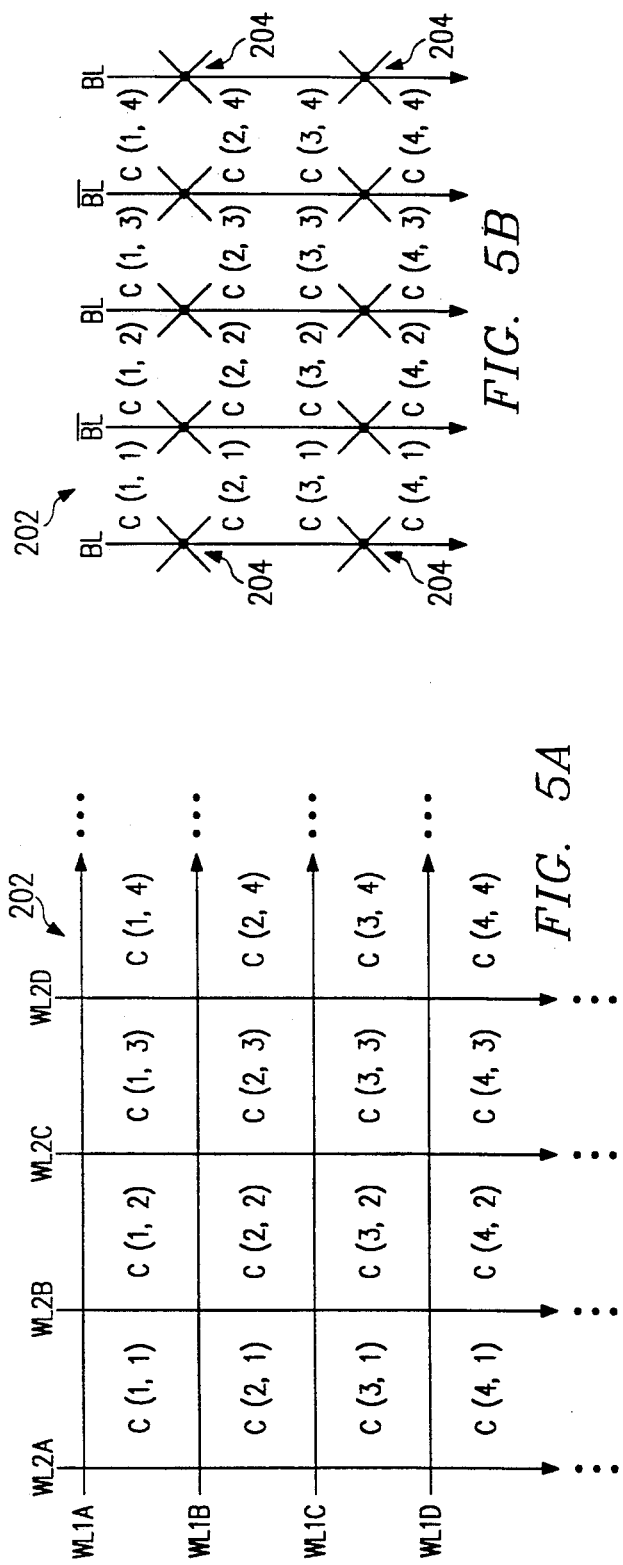
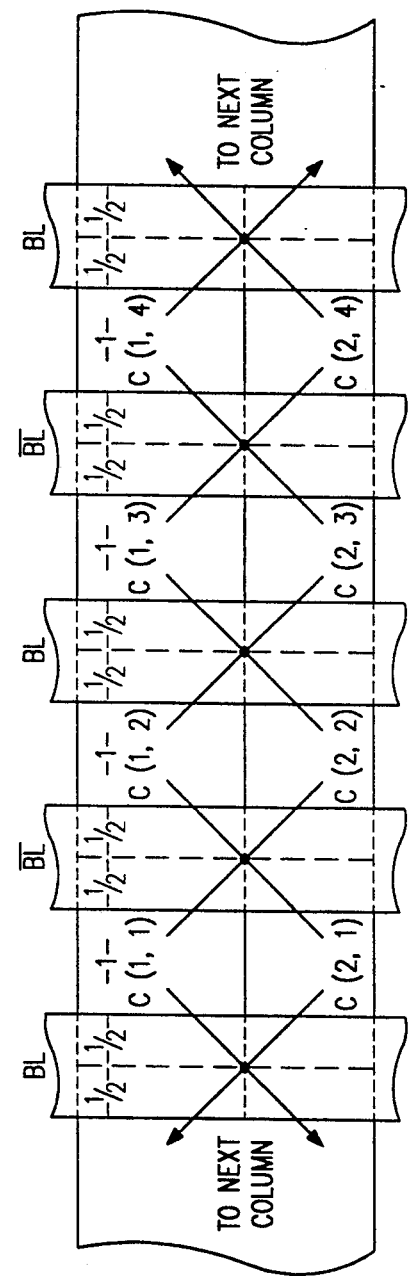
FIG. 5A
FIG. 5B
FIG. 5C

MEMORY CELL CIRCUIT AND ARRAY

TECHNICAL FIELD OF THE INVENTION

This invention relates to integrated circuits, and more particularly to a memory cell circuit and the operation thereof.

BACKGROUND OF THE INVENTION

In contemporary memory technology, static random access memory (SRAM) cells may be constructed in various circuit configurations. These circuits are constructed in order to provide data retention capabilities while minimizing power requirements, current leakage and overall device size. Consequently, it is desirable to construct a memory cell with a minimum number of components. For each component within the cell, there must also be consideration of the component size and both internal and external interconnections to the component.

A typical contemporary SRAM cell is constructed in a 4T-2R configuration. The two resistances within this configuration may either comprise resistor elements or switched capacitors utilized in order to create an equivalent resistance. Although the 4T-2R cell is compact, the pass transistors constructed as a part of the cell are of critical size because the remaining transistors of the cell must be constructed in a size directly proportional to the size of the pass transistors. As a result, the selection of a predetermined size for the pass transistor necessarily defines a larger size for the remaining transistors within the cell. Thus, larger transistors and accommodating resistors must be included within the cell, thereby undesirably increasing device size and power requirements. Further, the large resistors require a large amount of resistance in a relatively small area thereby producing additional problems known in the art.

Alternatively, the resistors of a 4T-2R cell may be constructed utilizing switched capacitive resistances. This device requires a total of eight transistors in order to complete the cell configuration. Thus, the use of switched capacitive resistances requires a total of eight transistors with numerous interconnections to the gates, sources and drains of these transistors. Each external interconnection requires contact to the device and consequently consumes more surface area on the device. As a result, device sizes are increased along with device capacitance and other problems such as manufacturability and yield associated with the large number of required interconnections to the memory cell.

Therefore, a need has arisen for a memory cell which includes a minimum number of devices and associated interconnections, consumes minimal power and may be constructed within a small area.

SUMMARY OF THE INVENTION

In accordance with the present invention, a memory cell circuit and array, and the method of forming the same, and the operation thereof are provided which substantially eliminate and prevent disadvantages and problems associated with prior memory cell devices.

A memory array constructed in accordance with the present invention comprises a plurality of cells, wherein each cell is operable in two modes. Each of the two modes is effected through the combination of a first and second signal. The memory array further comprises a first conductive line operable to transmit the first signal, and a second conductive line substantially orthogonal to said first conductive line, and operable to transmit the second signal.

Each of the plurality of cells in the present invention may comprise a first series-coupled pair of transistors, and second series-coupled pair of transistors. Further, each cell may include a pair of cross-coupled transistors coupled between said first and second pair of series-coupled transistors.

The present invention provides numerous technical advantages over prior memory cell configurations. A memory cell constructed in accordance with the present invention includes a minimal number of devices used to effect efficient data storage and retrieval. Further, the use of orthogonal wordlines provides the technical advantage of simplified fabrication processes. As a result, there is the technical advantage of reduced fabrication costs. Use of orthogonal wordlines allows the technical advantage of full decoding of a memory array at each cross-point created by two intersecting wordlines. This "cross-point" accessing feature permits only one cell to be active at a time, thereby providing the technical advantage of reduced active power consumption. The orthogonal wordlines further permit the sharing of bitlines and contacts, hence reducing cell size and increasing manufacturability. The reduced cell size of the present invention further provides the technical advantage of reduced surface area consumption, thereby providing for higher packing densities in a given area.

BRIEF DESCRIPTION OF THE DRAWINGS

For a more complete understanding of the present invention and the advantages thereof, reference is now made to the following description taken in conjunction with the accompanying drawings in which:

FIG. 3 illustrates a schematic of a memory cell constructed and operated in accordance with the present invention;

FIG. 4A illustrates a diagrammatical view of an array of memory cells constructed in accordance with the present invention and having parallel wordlines;

FIG. 4B illustrates a diagrammatical view of an array of cells and the interrelationship of the contact between individual cells and respective bitlines;

FIG. 4C illustrates the spatial requirements of individual cells constructed in accordance with the array of FIG. 4A;

FIG. 5A illustrates a diagrammatical view of an array of memory cells constructed in accordance with the present invention and having orthogonal wordlines;

FIG. 5B illustrates view of an array of cells and the interrelationship of the contact between individual cells and respective bitlines;

FIG. 5C illustrates the spatial requirements of individual cells constructed in accordance with the array of FIG. 5A;

FIG. 6A illustrates a schematic of the cross-coupled transistors of a memory cell constructed in accordance with the present invention;

FIG. 6B illustrates a schematic of an alternative format for cross-coupling transistors in a memory cell constructed in accordance with the present invention;

DETAILED DESCRIPTION OF THE INVENTION

Figure 1:
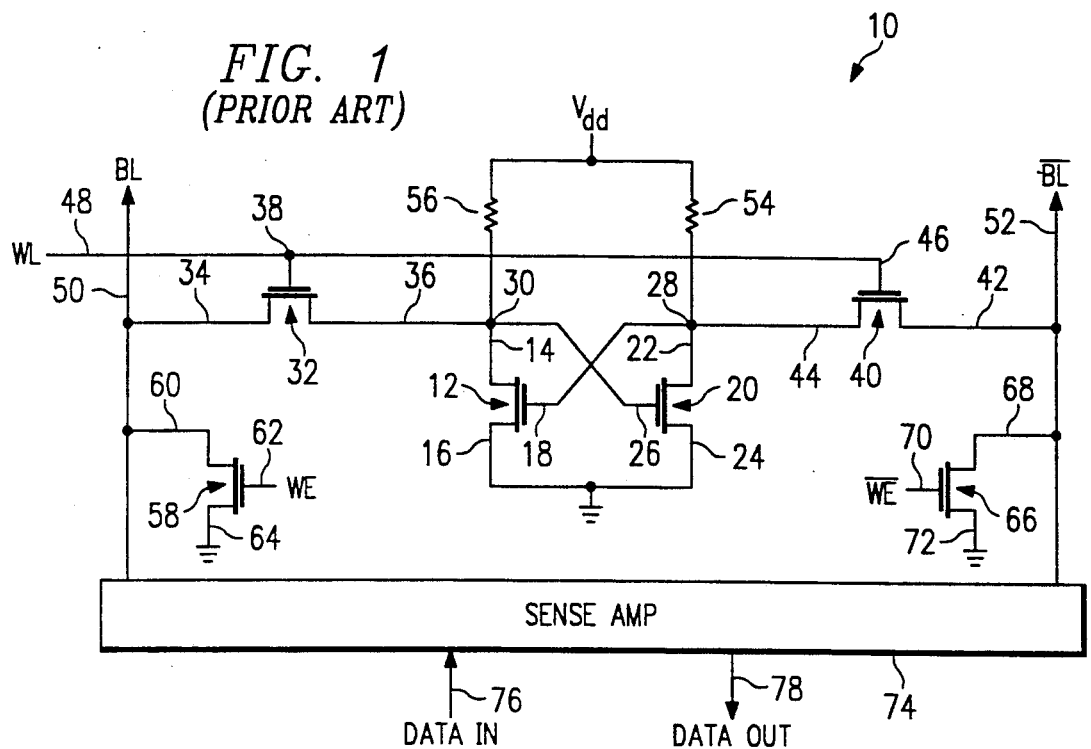
FIG. 1 illustrates a prior art 4T-2R SRAM memory cell.

FIG. 1 illustrates a prior art memory cell designated generally at 10. Memory cell 10 includes a storage device comprising a first transistor 12 having a drain 14, a source 16 and a gate 18 and a second transistor 20 having a drain 22, a source 24 and a gate 26. First and second transistors 12 and 20 are connected in a crossed-coupled configuration. Accordingly, gate 18 of first transistor 12 is connected to drain 22 of second transistor 20. This gate-to-drain connection of first transistor 12 to second transistor 20 defines a first node 28. Similarly, gate 26 of second transistor 20 is connected to drain 14 of first transistor 12. This gate-to-drain connection of second transistor 20 to first transistor 12 defines a second node 30. The sources 16 and 24 of first and second transistors 12 and 20 are connected together and are further connected to ground.

Memory cell 10 further includes a first pass transistor 32 having a drain 34, a source 36 and a gate 38. Similarly, memory cell 10 includes a second pass transistor 40 including a drain 42, a source 44, and a gate 46. Sources 36 and 44 of pass transistors 38 and 46 are connected to second and first nodes 30 and 28 respectively. Gates 38 and 46 of pass transistors 32 and 40 are connected together and are further connected to a wordline 48. Drain 34 of first pass transistor 32 is connected to a bitline 50. Drain 42 of second pass transistor 40 is connected to an inverted bitline 52. First and second nodes 28 and 30 are connected to a supply voltage, $V_{dd}$, through resistors 54 and 56 respectively.

A write enable transistor 58 includes a source 60, a gate 62 and a drain 64. Source 60 of write enable transistor 58 is connected to bitline 50. Gate 62 of write enable transistor 58 is operable to receive a write enable signal denoted WE. Similarly, a second write enable transistor 66 includes a source 68, a gate 70 and a drain 72. Source 68 is connected to inverted bitline 52. Gate 70 of second write enable transistor 66 is operable to receive the inverse of write enable signal. Drains 64 and 72 of write enable transistors 58 and 66 are connected to ground. Both bitline 50 and inverted bitline 52 are also connected to sense amp 74. Sense amp 74 has an input 76 for receiving data and an output 78 for outputting data. While write enable transistors 58 and 66 are shown as part of cell 10, it should be understood as known in the art that a plurality of cells may be connected in an array wherein each column of the array has a single pair of write enable transistors connected thereto.

The operation of memory cell 10 in general is as follows. Memory cell 10 operates in two different modes. The first mode is a non-access or storage mode in which memory cell 10 retains a data value representative of either a binary zero or one. The second mode of operation for memory cell 10 is an access mode in which binary information is either read from or written to memory cell 10.

In the non-access or storage mode, the wordline signal and corresponding wordline 48 are low. Accordingly, first and second pass transistors 32 and 40 are in a non-conducting state and therefore, cross-coupled transistors 12 and 20 are effectively isolated from bitline 50 and inverted bitline 52. In this mode, depending on the binary value stored by memory cell 10, either first transistor 12 or second transistor 20 is on while the opposing transistor is off. For example, consider the instance where first transistor 12 is on while second transistor 20 is off. With first transistor 12 on, second node 30 will be effectively coupled through transistor 12 to ground. Accordingly, gate 26 of second transistor 20, which is connected to second node 30, is low thereby maintaining second transistor 20 in a non-conducting state. With second transistor 20 in a non-conducting state, gate 18 of first transistor 12 is coupled through resistor 54 to the supply voltage, $V_{dd}$.

The resistance value of resistor 54 is selected so that in the example described above a sufficient voltage is retained at second node 28 and gate 18 of first transistor 12 in order to maintain first transistor 12 in a conducting state. However, as is known in the art, current will slowly leak from first node 28 and therefore the resistance value of resistor 54 must be chosen at a suitable resistance in order to allow sufficient current to be drawn from the power supply voltage in order to compensate for the current which leaks from first node 28. Additionally, in order to accommodate the increase of resistance with the increase of temperature, the resistance value of resistor 54 must be selected such that sufficient current is provided to first node 28 during this exemplary mode notwithstanding fluctuations in temperature. It should be noted that due to the symmetric construction of memory cell 10 that the selection of resistance 56 is the same as that for resistor 54 so that the cell may operate in an opposite fashion, that is, where second transistor 20 is conducting while first transistor 12 is not.

During the second or access mode for memory cell 10, the wordline signal on wordline 48 is high causing pass transistors 32 and 40 to conduct. As a result, first and second nodes 28 and 30 are coupled through pass transistors 46 and 38 to inverted bitline 52 and bitline 50, respectively. Once this connection is established, memory cell 10 may either be written to with data, or in the alternative, data may be read therefrom. In order to write to memory cell 10 during the second mode wherein pass transistors 32 and 40 are conducting, data is transferred to sense amp 74 via input 76. Sense amp 74 provides complementary signals to gates 62 and 70 of write enable transistors 58 and 66, respectively, as known in the art. Accordingly, the write enable signal is applied in order to selectively ground either bitline 50 or inverted bitline 52. As a result, cross-coupled transistors 12 and 20 may be maintained at their current state or may be switched to an alternative state. In order to read data from memory cell 10, sense amp 74 senses the relative amplitudes of the signals on bitline 50 and inverted bitline 52 and provides a data output via output 78 as known in the art. Memory cell 10 therefore provides a 4T-2R configuration for storage/retrieval of data. Although only four transistors are necessary, overall device size is increased due to the resistors included within the cell. Further, complexity and costs of fabrication are increased due to the inclusion of resistors.

Figure 2:
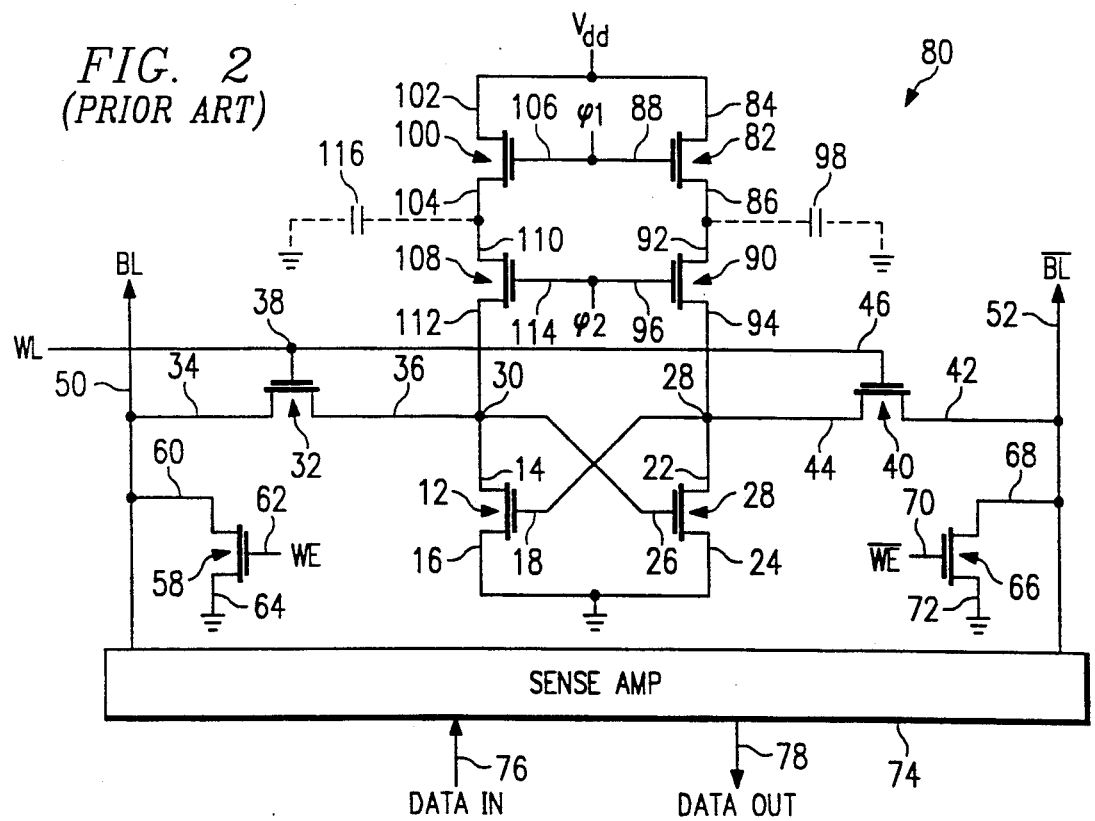
FIG. 2 illustrates a prior art 4T-2R SRAM memory cell utilizing switched transistors to provide equivalent resistance for the two resistive elements therein.

FIG. 2 illustrates a prior art eight transistor memory cell designated generally at 80. Memory cell 80 of FIG. 2 is similar to memory cell 10 of FIG. 1 and therefore like parts of both memory cells have been given like designation numerals. However, resistors 54 and 56 of memory cell 10 are each replaced within memory cell 80 by a respective switched capacitive system. The switched capacitive system replacing resistor 54 comprises a first transistor 82 having a drain 84, a source 86 and a gate 88, and a second transistor 90 having a drain 92, a source 94 and a gate 96. Source 86 of first transistor 82 is connected to drain 92 of second transistor 90. This connection is further connected to a parasitic capacitor 98 (shown in phantom) which is further connected to the device substrate. Typically the substrate is connected as shown, that is, to ground.

In a similar fashion to the above description, resistor 56 of memory cell 10 shown within FIG. 1 is replaced in FIG. 2 by a two transistor switched capacitive configuration. This configuration includes a third transistor 100 having a drain 102, a source 104 and a gate 106. Additionally, the switched capacitive configuration includes a fourth transistor 108 including a drain 110, a source 112 and a gate 114. Source 104 of third transistor 100 is connected to drain 110 of fourth transistor 108. This connection is further connected to a parasitic capacitor 116 (shown in phantom) which like parasitic capacitor 98 is further connected to the device substrate which is typically connected to ground. Drains 84 and 102 of transistors 82 and 100, respectively, are connected to the power supply voltage $V_{dd}$. Gates 88 and 106 of transistors 82 and 100 are connected to one another and are operable to receive a first clocking signal, $\phi1$. Similarly, gates 96 and 114 of transistors 90 and 108 are connected and are operable to receive a second clocking signal, $\phi2$.

Memory cell 80 operates in the same two modes discussed in connection with memory cell 10 of FIG. 1. The second mode or access mode occurs in an identical fashion as that described in connection with memory cell 10 of FIG. 1. However, in the first mode, the transistor pairs comprising first and second transistors 82 and 90 and third and fourth transistors 100 and 108 provide an equivalent resistance to the resistance provided by resistors 54 and 56 shown in FIG. 1. In particular, and as known in the art, the combination of first and second transistors 82 and 90 along with the capacitance provided by parasitic capacitor 98 may be clocked in such a way that resistance may be approximated by:

$$R = \frac{1}{fc} \quad \text{EQN. 1}$$

where,

R is the equivalent resistance of a switched transistor pair;

f is the frequency of the clocking signals, $\phi1$ and $\phi2$; and

C is the capacitance of parasitic capacitor 98.

Similarly, third and fourth transistors 100 and 108 operate also to provide an equivalent resistance in accordance with equation 1 above. In particular, clock signals $\phi1$ and $\phi2$ are non-overlapping clock signals which cause transistors 82 and 100 to conduct at one point in time and transistors 90 and 108 to conduct at a separate point in time. This alternative switching causes charge during the first point in time to be transferred from the power supply voltage $V_{dd}$ through transistors 82 and 100 to parasitic capacitors 98 and 116, respectively. Thereafter, $\phi1$ is low while $\phi2$ is high, causing transistors 90 and 108 to conduct. During this conduction state, charge may pass from parasitic capacitors 98 and 116 to first node 28 and second node 30 respectively. Accordingly, an equivalent resistance is accomplished through the use of alternately switched transistor pairs.

Memory cell 80 of FIG. 2 therefore provides a memory device wherein the need for large resistors as discussed in connection with FIG. 1 is eliminated. However, a trade-off occurs because a total of eight device transistors (excluding write enable transistors 58 and 66) are necessary as opposed to the four transistors associated with memory cell 10 of FIG. 1. Additionally, memory cell 80 of FIG. 2 requires interconnections between the added transistors and includes separate connections for the bitlines and wordlines to the pass transistors of the memory cell. The present invention minimizes the number of transistors utilized within the cell while further minimizing the number of interconnections associated therewith.

FIG. 3 illustrates a memory cell 118 and control circuit 119 constructed and operated in accordance with the present invention. Memory cell 118 includes a pair of cross-coupled transistors, including a first transistor 120 and a second transistor 122. In the preferred embodiment, first and second transistors 120 and 122 are n channel transistors. First transistor 120 includes a source 124 connected to a first node 126. The gate 128 of first transistor 120 is connected to a second node 130. The drain 132 of first transistor 120 is connected to ground. Second transistor 122 is cross-coupled to first transistor 120. Accordingly, the source 134 of second transistor 122 is connected to second node 130 which is connected to gate 128 of first transistor 120. The gate 136 of second transistor 122 is connected to first node 126. The drain 138 of second transistor 122 is connected to ground.

First node 126 is coupled to a bitline 140 through a series connected pair of transistors 142 and 144. In the preferred embodiment, transistors 142 and 144 are n channel transistors. A parasitic capacitance 145 (shown in phantom) exists between transistors 142 and 144 and the device substrate. Typically, this capacitance is connected as shown, that is, to ground. The source 146 of transistor 142 is connected to bitline 140. The gate 148 of transistor 142 is connected to a first wordline 149 (denoted "WL1") for receiving a clocking signal $\phi1$. The drain 150 of transistor 142 is connected to the source 152 of transistor 144. The gate 154 of transistor 144 is connected to a second wordline 153 (denoted "WL2") for receiving a clocking signal $\phi2$. The drain 156 of transistor 144 is connected to first node 126.

Second node 130 is coupled to inverted bitline 158 by a pair of series transistors 160 and 162. In the preferred embodiment, transistors 160 and 162 are n channel transistors. A parasitic capacitance 163 (shown in phantom) exists between transistors 160 and 162 and the device substrate. The source 164 of transistor 162 is connected to inverted bitline 158. The gate 166 of transistor 162 is connected to first wordline 149 for receiving the clocking signal $\phi1$. The drain 168 of transistor 162 is connected to the source 170 of transistor 160. The gate 172 of transistor 160 is connected to second wordline 153 for receiving the clocking signal $\phi2$. The drain 174 of transistor 160 is connected to second node 130.

Bitline 140 and inverted bitline 158 each have a respective write enable transistor 176 and 178 associated therewith. In particular, the source 180 of write enable transistor 176 is connected to bitline 140. The gate 182 of write enable transistor 176 is connected to receive a write enable signal (WE). The drain 184 of write enable transistor 176 is connected to ground. Similarly, write enable transistor 178 includes a source 186 connected to inverted bitline 158. The gate 188 is connected to receive the inverted write enable signal $\overline{WE}$. The drain 190 of write enable transistor 178 is connected to ground.

Both bitline 140 and inverted bitline 158 are connected to a sense amp 192 in the same manner as discussed in connection with FIGS. 1 and 2 above. Accordingly, sense amp 192 includes an input 194 for receiving data and an output 196 for outputting data.

The operation of memory cell 118 is as follows. Memory cell 118 operates, in general, in the same two different modes as those discussed in connection with FIGS. 1 and 2. Thus, the first mode is a non-access or storage mode in which memory cell 118 retains a data value. The second mode of operation of memory cell 118 is an access mode in which binary information is either read from or written to memory cell 118.

In the non-access or storage mode, the transistor pairs of transistor 142 and 144 and transistors 160 and 162 each operate as a respective switched capacitive configuration. In particular, during this mode, clocking signals $\phi1$ and $\phi2$ are caused to alternate by control circuit 119 such that clocking signal $\phi1$ is high while clocking signal $\phi2$ is low and vice versa. Thus, when clocking signal $\phi1$ is high, transistors 142 and 162 are on, while transistors 144 and 160 are off. Thereafter, the clocking signals alternate such that $\phi2$ goes high turning on transistors 144 and 160, while $\phi1$ goes low turning off transistors 142 and 162. In this manner, each of the respective transistor pairs connected between bitline 140 and first node 126 and inverted bitline 158 and second node 130 provide an equivalent resistance which may be approximated by:

$$R = \frac{1}{fC} \qquad \text{EQN. 2}$$

where
R is the equivalent resistance of the switched transistor pair;
f is the frequency of the clocking signals $\phi1$ and $\phi2$; and
C is the capacitance of either parasitic capacitor 145 or 163.

Thus, from the above, it may be appreciated that during the non-access mode of operation, the respective transistor pairs including transistors 142 and 144 and transistors 160 and 162 provide an equivalent resistance between bitline 140 and first node 126 and inverted bitline 158 and second node 130. Further, during the non-access mode, control circuit 119 connects both bitline 140 and inverted bitline 158 to the supply voltage, $V_{dd}$. Accordingly, charge may be transferred from lines 140 and 158 via the switched transistor pairs to first and second nodes 126 and 130, respectively.

Because resistance, R, is a function of frequency, f, logic circuitry may be provided in order to adjust resistance as desired. In particular, resistance may be favorably adjusted with changes in temperature. Thus, the frequency may be raised to provide a lower resistance for higher device temperatures. These higher temperatures create larger current leakage for each cell and, therefore, require larger amounts of current from the power supply voltage, $V_{dd}$; hence, a lesser resistance will provide this additional current. Alternatively, the frequency may be lowered to provide a larger resistance for lower device temperatures. The logic circuitry used for adjusting the frequency is preferably provided on the same chip as the array of memory cells.

In the second or access mode of operation, each transistor pair, including transistors 142 and 144 and transistors 160 and 162, operate as pass transistors in a manner similar to that discussed in connection with FIG. 2. In particular, during the access mode, clocking signals $\phi1$ and $\phi2$ are both held at a high potential by control circuit 119. Accordingly, each of transistors 142, 144, 160 and 162 conduct. Thus, first node 126 is connected to bitline 140 and second node 130 is connected to inverted bitline 158. Control circuit 119 no longer maintains bitline 140 and inverted bitline 158 at $V_{dd}$. Instead, during the access mode, lines 140 and 158 are controlled by sense amp 192 as known in the art for read/writing memory cell 118. Thus, during the access mode, data may be written to, or read from, the cell utilizing bitline 140, inverted bitline 158, and sense amp 192.

From the above description, it may be appreciated that the present invention provides a memory cell having dual purpose transistor pairs, including transistors 142 and 144 and transistors 160 and 162. Each transistor pair performs a different function during the two general modes of operation for the memory cell. In particular, during the non-access mode of operation, each transistor pair provides an equivalent resistance between a respective bitline and node of the memory cell. During the second or access mode of operation, each transistor pair operates as an equivalent pass transistor in order to provide access in order to either read from, or write to, the memory cell. This duality of function for the transistor pairs provide improved benefits associated with the cell for each of the two functions performed by the transistor pairs. For example, during the first mode where the first transistors operate as equivalent resistances, the use of switched transistor pairs permits reduced device size and implementation of resistance without the need for fabricating a resistor within a small area. By utilizing the same transistor pairs as pass transistors during the second or access mode of operation, an overall reduction in the number of transistors for the cell is achieved. Further, no independent external connection of each cell to the power supply voltage is necessary and therefore, the number of external interconnections is significantly reduced. This reduction in external connection increases device efficiency, reduces device size and leakage and improves both ease and cost of device fabrication.

FIG. 4A illustrates a diagrammatical view of an array of cells denoted generally at 198. For simplification purposes, each cell is denoted as a "C". For illustrative purposes, array 198 is shown as having four rows of cells and four columns of cells in a typical matrix format with each cell being designated parenthetically by its row and column location (i.e., "(row, column)"). It should be understood, that array 198 may comprise any number of cells as would be desired by one skilled in the art. Each row within array 198 includes a pair of wordlines denoted WL1 and WL2. For purposes of explanation, the wordlines of the first array row are designated with an "A", while the wordlines for the second row are designated with a "B", and so forth. The wordlines permit clocking signals $\phi 1$ and $\phi 2$ to be connected to each cell within any given row of array 198 as discussed above in connection with FIG. 3. Thus, WL1 and WL2 may be held high during the access mode so that each cell within a given row may be accessed. Alternatively, WL1 and WL2 may be clocked in a non-overlapping fashion in a non-access or storage mode in which each memory cell of the row retains a data value.

From the illustration of FIG. 4A, it may be appreciated that during the access mode, where WL1 and WL2 of a given row are alternatively clocked, each cell within that row will load on its respective bitline and inverted bitline. Thus, in the example illustrated, if the first row of cells are in an access mode, then a significant current drain will occur from the cumulative effect of the current pulled off each respective bitline and inverted bitline connected to the row of cells. It is therefore desirable to present a mechanism in which this cumulative current drain is reduced. An additional aspect of the present invention provides for such a mechanism and is discussed in greater detail below.

FIG. 4B illustrates a diagrammatical view of array 198 without the wordline connections, but with bitline connections for purposes made apparent below. As described above with reference to FIG. 4a, a cell within array 198 is accessed along with the remainder of the cells along the same row. Accordingly, no two cells adjacent one another in the same column are accessed at the same time. Thus, it is permissible for two cells in the same column to contact the same bitline and inverted bitline without one cell interfering with the operation of the other cell. Accordingly, one contact point 200 is the contact to either a bitline or inverted bitline for two cells adjacent one another and in the same column. Thus, cell C(1,1) and cell C(2,1) may share a contact point 200 for each necessary connection to either the bitline or the inverted bitline. This sharing of a contact is illustrated in FIG. 4B as lines drawn from each contact 200 toward an associated cell.

As a result of the contact sharing, a cell is said to require only a "one-half contact" for each connection to either the bitline or inverted bitline. Further, because each cell requires a one-half contact to the bitline and a one-half contact to the inverted bitline, it is said that each cell requires a total of one contact per cell. This concept is further illustrated in FIG. 4C, immediately below. Contact 200 is preferably a metal contact, and is discussed in greater detail below with reference to FIGS. 11A and 11B.

FIG. 4C illustrates the first two rows and first three columns of array 198 in general layout form. From FIG. 4C it may again be appreciated that each pair of cells shares a pair of contacts and thus that each cell requires a total of one contact (i.e., $2 \times \frac{1}{2}$ contact) in order to contact the cell to its respective bitline and inverted bitline. FIG. 4C further illustrates the spatial requirements for each cell within array 198. In particular, each bitline or inverted bitline requires a metal line which is said to span one "metal width" as is known in the art. Each metal line must be spaced apart from a parallel metal line by one "metal space", and a metal space is typically the same width as a metal line. Accordingly, it may be appreciated that a single cell spans a total area of two metal widths and two metal spaces. Thus, for a complete layout of cells fabricated in accordance with the principles illustrated in FIGS. 4A through 4C, each cell has the cumulative requirements of two metal spaces, two metal lines and one contact in order to fully accommodate the requirements of the cell. FIGS. 5A through 5C below illustrate additional inventive concepts included within the present invention in order to further reduce the metal spaces, metal lines and contact requirements for each cell within array 198.

FIG. 5A illustrates an array of cells indicated generally at 202. Again, array 200 includes cells organized in a row-by-column matrix format and each cell within the array is designated by row and column location. For illustrative purposes, bitlines are not illustrated in FIG. 5A, but will be discussed in greater detail in referencing FIGS. 5B and 5C, below. Each cell within array 202 again has two wordlines associated therewith; however, rather than displacing the wordlines in parallel fashion as shown in FIG. 4A, the wordlines in FIG. 5A are orthogonal to one another. A cell is placed in one of the two modes (i.e., access or storage) by "cross-point" reference, that is, by utilizing the two wordlines which cross, or intersect, at the point of the cell. For example, cell C(1,1) is placed in one of its two modes by the combination of WL1A and WL2B. Thus, it may be appreciated that the configuration illustrated in FIG. 5A permits access or storage to a particular cell through the use of orthogonal wordlines as opposed to parallel wordlines as discussed above. As a result, only a single cell within array 202 is either in the access or storage mode at a time. Accordingly, there is no instance where two adjacent cells, either in the same row or the same column, are in the access or storage mode simultaneously. As will be made more apparent below, this reduction in the number of cells which are simultaneously accessed, or stored to, permits a reduction in overall cell size and improves the constraints on circuit fabrication techniques. The smaller cell size further reduces the overall dimensions of the array. Additionally, the active power consumption of the array is reduced because only a single cell is accessed at a time, as opposed to a group, or possibly a row, of cells, as is the case in the prior art.

FIG. 5B illustrates array 202 without the wordlines discussed in FIG. 5A, but with the addition of the bitlines necessary to complete the cells of the array. Each cell within the array is connected to its respective bitline and inverted bitline by a contact point 204. As discussed above in connection with FIG. 5A, no two cells either adjacent in a column, or adjacent in a row, may be accessed at a time due to the use of orthogonal wordlines. As a result, a single bitline or inverted bitline may be contacted to four different cells. For example, considering the four cells in a square comprising cell C(1,1), C(1,2), C(2,1) and C(2,2), it may be appreciated that only one of these four cells may be accessed at a time. As a result, each cell may share the same inverted bitline without having an adverse effect on any three inactive cells while one cell among the group is activated (i.e., accessed or stored to). Thus, it may be appreciated that each contact point 204 serves four different cells. As a result, it is said that each cell requires only a one-fourth contact point in order to make a connection either to a bitline or an inverted bitline. Thus, each cell requires a total of one-half (i.e., $2 \times \frac{1}{4}$) contact in order to complete the necessary contact for the cell to both a bitline and an inverted bitline. As is described below in FIG. 5C, this reduced number of bitlines and contacts reduces the overall cell and array size.

FIG. 5C illustrates a spatial view of the first three cells within row one of array 202 in a manner similar to that shown in FIG. 4C. As described in connection with FIG. 5B, however, a single contact point 204 provides connection for four different cells. Additionally, a single bitline may service a pair of cells on each side of the bitline and, therefore, only one-half of each bitline is required per cell. As a result, it is said that each cell requires only a single metal line (i.e. $2 \times \frac{1}{4}$) per cell. The reduction in the number of metal line widths per cell further reduces the number of metal line spaces per cell, so that each cell requires only one metal line space as illustrated. As a result, each cell in the embodiments of FIGS. 5A through 5C requires one metal line width, one metal line space and one-half metal contact. As a result, the overall dimensions of the cell may significantly reduced along with the complexity of the fabrication thereof.

FIGS. 6A and 6B illustrate an additional inventive aspect utilized with the present invention to further minimize the required area and complexity for constructing a cell in accordance with the present invention. In particular, FIG. 6A illustrates the cross-coupled transistors 120 and 122 shown in FIG. 3. Recall, node 126 is connected to bitline 140 (not shown) through a pair of series-connected transistors 142 and 144 while node 130 is connected to inverted bitline 158 (not shown) through a pair of series-connected transistors 160 and 162.

The cross-coupling of gates 128 and 136 of transistors 120 and 122, respectively, would require, if fabricated as shown in FIG. 6A, an actual crossing over of the necessary interconnecting material used to construct this connection. Typically, this connection is made by using separate metal layers in order to connect gate 136 to node 126 and gate 128 to node 130. The use of separate metal layers requires separate and independent processing steps in order to fabricate each metal layer. Further, because one layer must overlie the other, the fabrication thereof requires a taller device in order to accommodate the two layers and typically to further accommodate an insulating layer formed between those two layers. FIG. 6B, however, illustrates an alternative interconnecting scheme included within the present invention and which may be used in order to eliminate the necessity for crossing metal layers in order to cross-couple transistors 120 and 122.

FIG. 6B illustrates a schematic and representative view of an alternative layout format for the cross-coupled transistors 120 and 122 shown in FIG. 6A. In particular, from the illustration shown in FIG. 6B, it may be appreciated that one of the two cross-coupled transistors (and in the particular illustration, transistor 122) may be inverted such that the cross-coupling of the gate of one transistor to a source/drain of the opposing transistor lies parallel, rather than crossing one another, as shown in FIG. 6A. The use of parallel connections, rather than cross-over connections, in order to interconnect cross-coupled transistors 120 and 122 eliminates the use of multi-metal layers as discussed in connection with FIG. 6A. As a result, fabrication of the interconnections between transistors 120 and 122 is significantly improved because only a single process is necessary in order to form both interconnections, and further because the overall device size is reduced because a single layer may be used in order to form both interconnections between the two transistors. The particular advantages of this "parallel cross-coupling" are further apparent in the discussion of FIGS. 7A through 11B, below.

FIGS. 7A through 11A illustrate top views of the preferred fabrication process for constructing an array of memory cells in accordance with the present invention. FIGS. 7B through 11B illustrate cross-sectional views of the top views shown in FIGS. 7A through 11A. For simplicity of explanation, the cross-sectional views herein will illustrate the formation of one-half of a cell constructed in accordance with the present invention. In particular, the cross-sectional views will illustrate the formation of one cross-coupled transistor and its associated series-connected pair of transistors.

Figure 7A:
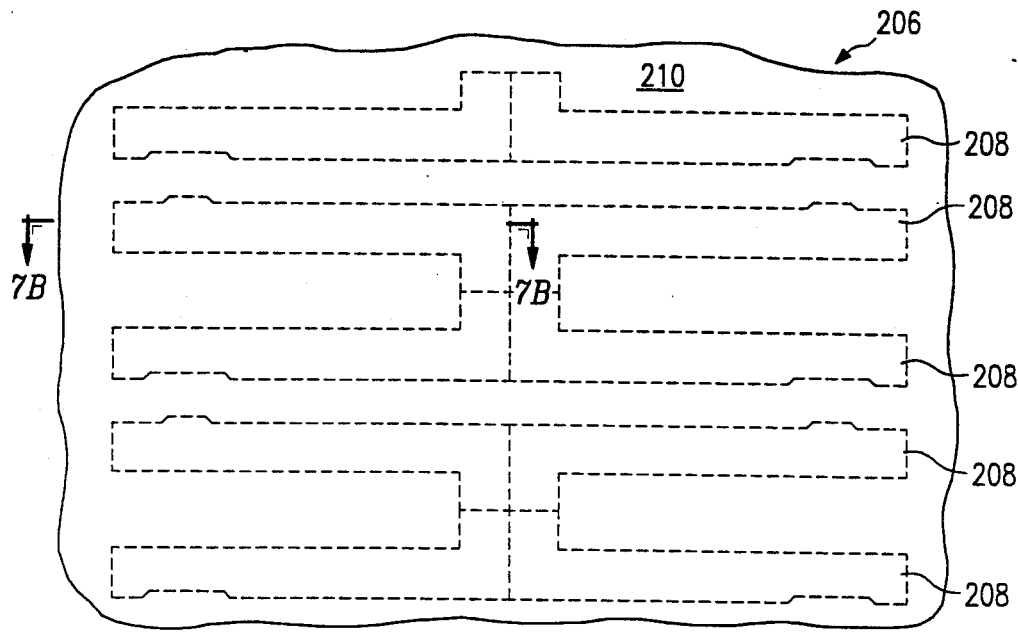
FIG. 7A illustrates a top view of active regions formed in order to construct an array of memory cells.

FIG. 7A illustrates a top view of an array region denoted generally at 206. Array region 206 is the area in which is desirable to construct an array of cells in accordance with the present invention. A group of moat regions 208 are defined within array region 206. Moat regions 208 are the areas where it is desirable to build active devices. Typically moat regions 208 are semiconductor areas which are exposed by patterning and etching a field insulating region denoted generally at 210. Thus, the patterninq and etching of field insulating region 210 exposes semiconductor areas which define moat regions 208 where active devices (i.e., memory cells in the present example) may be constructed.

Figure 7B:
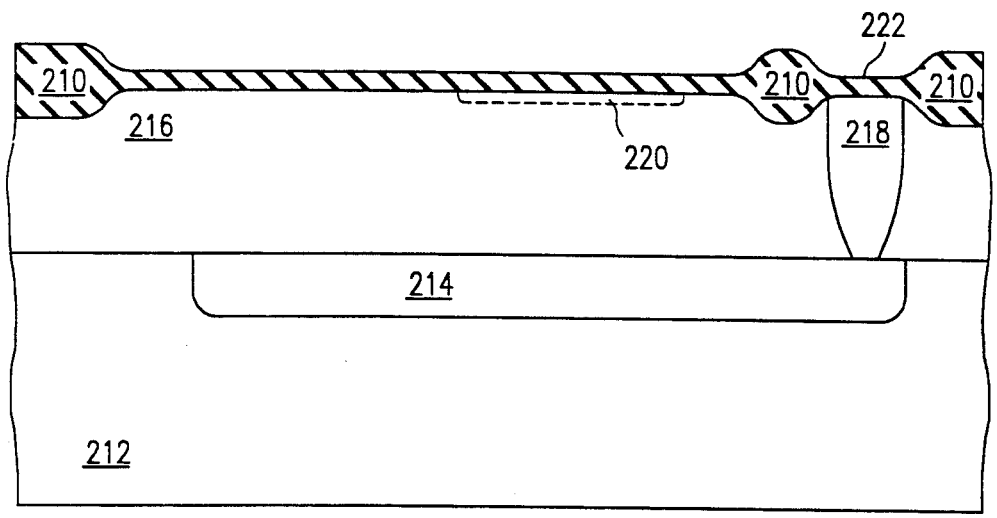
FIG. 7B illustrates a cross-sectional view of the memory cell regions of FIG. 7A.

FIG. 7B illustrates a cross-sectional view of FIG. 7A along lines 7B—7B. From the perspective in FIG. 7B, it may be appreciated that the semiconductor region includes a semiconductor substrate 212 having a buried diffused region 214 formed therein. An epitaxial semiconductor layer 216 is formed over semiconductor substrate 212. In the preferred embodiment, semiconductor substrate 212 is a P− substrate. Buried diffused region 214 is formed by diffusing an N++ layer within semiconductor substrate 212. More particularly, buried diffused region 214 is formed by implanting antimony at dosage of $1E15/cm^2$, and annealing the implant at 1000° C. for one hour. This implant dosage and energy translates to an ion concentration on the order of $2E19/cm^2$. Epitaxial semiconductor layer 216 is grown over semiconductor substrate 212 at a thickness on the order of 1μ.

A buried diffused region contact 218, preferably of an N+ diffused region, extends through epitaxial semiconductor layer 216 and makes contact to buried diffused region 214. Contact 218 is formed by patterning epitaxial semiconductor layer 216 and implanting an N+ material, such as phosphorous, at a dosage of 1E16 and an energy of 100 KeV. Thereafter, the dopants are driven to extend sufficiently through epitaxial semiconductor layer 16 to contact buried diffused region 214. In the preferred embodiment, contact 218 is constructed as disclosed in pending U.S. patent application Ser. No. 07/444,508, entitled "Process for Simultaneous Formation of Trench Contact and Vertical Transistor Gate and Structure", by Roger Haken and Robert H. Eklund, filed Dec. 1, 1989, which is incorporated fully herein by reference. Buried diffused region contact 218 is utilized in order to make electrical contact to buried diffused region 214. However, it should be understood that contact 218 is not part of each individual memory cell, but rather is necessary only to provide electrical contact to buried diffused region 214 as will be described in greater detail below. It should also be noted that contact 218 may be formed away from the remainder of the cell components, but is shown in proximity thereto solely for illustrative purposes.

A transistor threshold voltage region 220 is optionally formed within epitaxial semiconductor layer 216. Region 220 is formed by patterning and implanting epitaxial semiconductor layer 216 with boron at a dosage on the order of $5E11/cm^2$. Region 220, if used, will serve to adjust the threshold voltage for the series-connected transistors to be formed in epitaxial semiconductor layer 216. An insulating layer 222 is formed at the surface of epitaxial semiconductor layer 216. Insulating layer 222 typically comprises a grown oxide on the order of 250 angstroms in thickness.

Figure 8A:
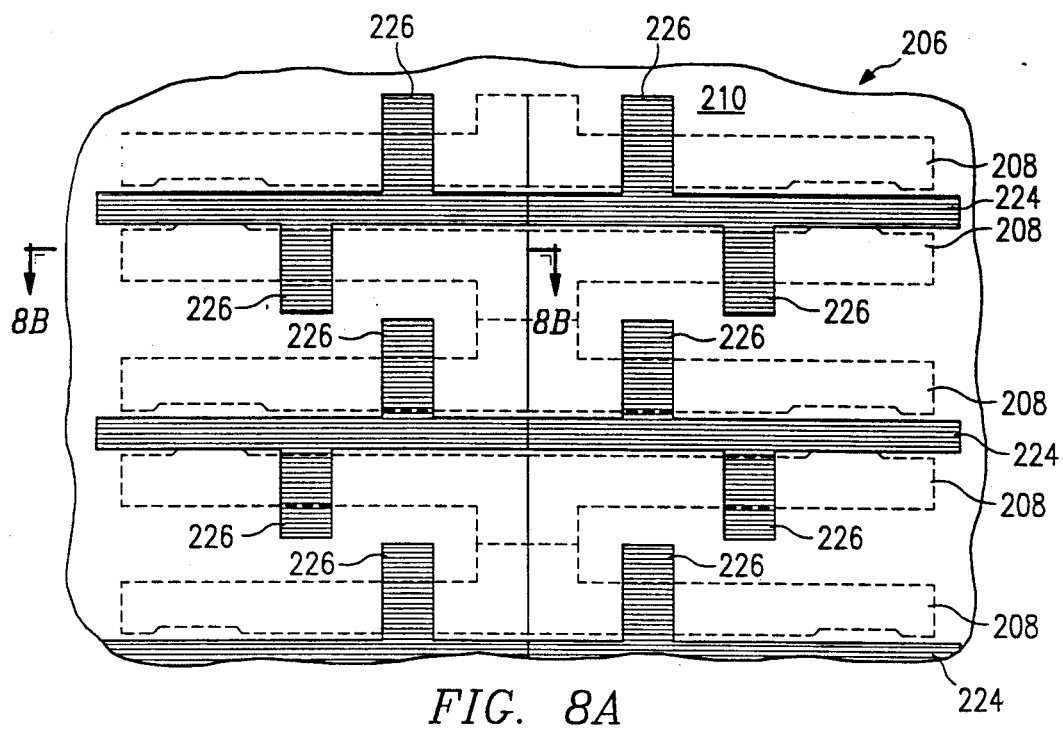
FIG. 8A illustrates a top view of a cell array having gate conductor regions disposed thereon.

FIG. 8A illustrates a top plan view of array region 206 after the formation of first gate conductor regions 224. As illustrated, first gate conductor regions 224 extend parallel to moat regions 208 and include gate conductor extensions 226 extending orthogonal from first gate conductor region 224 and over moat regions 208. Gate conductor regions 208 and extensions 226 are on the order of $0.8\mu$ in width. The additional construction details of first gate conductor regions 224 and conductor extensions 226 are described in greater detail below in connection with FIG. 8B.

Figure 8B:
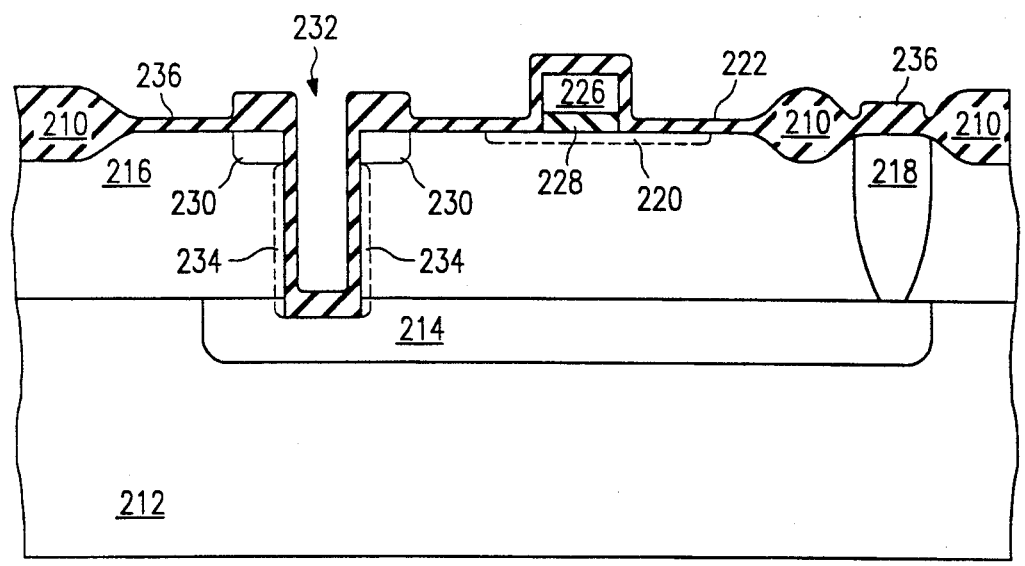
FIG. 8B illustrates a cross-sectional view of FIG. 8A, including a first gate conductor and a trench formed within the epitaxial semiconductor layer.

FIG. 8B illustrates a cross-sectional view of array 206 following the formation of gate conductor extension 226. Gate conductor extension 226 is formed by depositing a polysilicon layer over insulating layer 222 (FIG. 7B) and then etching the combination to form gate conductor extension 226 overlying gate conductor insulator 228. As will become more readily apparent below, gate conductor 226 will be operable as the gate for one of the two series connected transistors discussed in connection with FIG. 3.

A trench transistor source/drain region 230 is formed within epitaxial semiconductor layer 216. Trench transistor source/drain region 230 is preferably formed by first patterning epitaxial semiconductor layer 216 and then implanting an N-type dopant, such as phosphorus or arsenic at an energy level on the order of $5E15/cm^2$. The implanted region is thermally annealed at a temperature of 900° C. for a time period of 30 minutes. Trench transistor source/drain region 230 will form one of two source/drain regions for one of the two cross-coupled transistors. Following the formation of trench transistor source/drain region 230, a trench 232 is cut through epitaxial semiconductor layer 216 and source/drain region 230. Trench 232 may extend slightly within buried diffused region 214. Typically, trench 232 is formed by patterning epitaxial semiconductor layer 216 and etching trench 232 therethrough. A trench transistor threshold voltage region 234 is optionally formed along the sides of trench 232. Threshold voltage regions 234 is formed by an angled ion implantation into the sides of trench 232. The dosage and energy of the implantation is selectable by one skilled in the art in order to adjust the threshold voltage of the trench transistor to be constructed within trench 232.

Figure 9A:
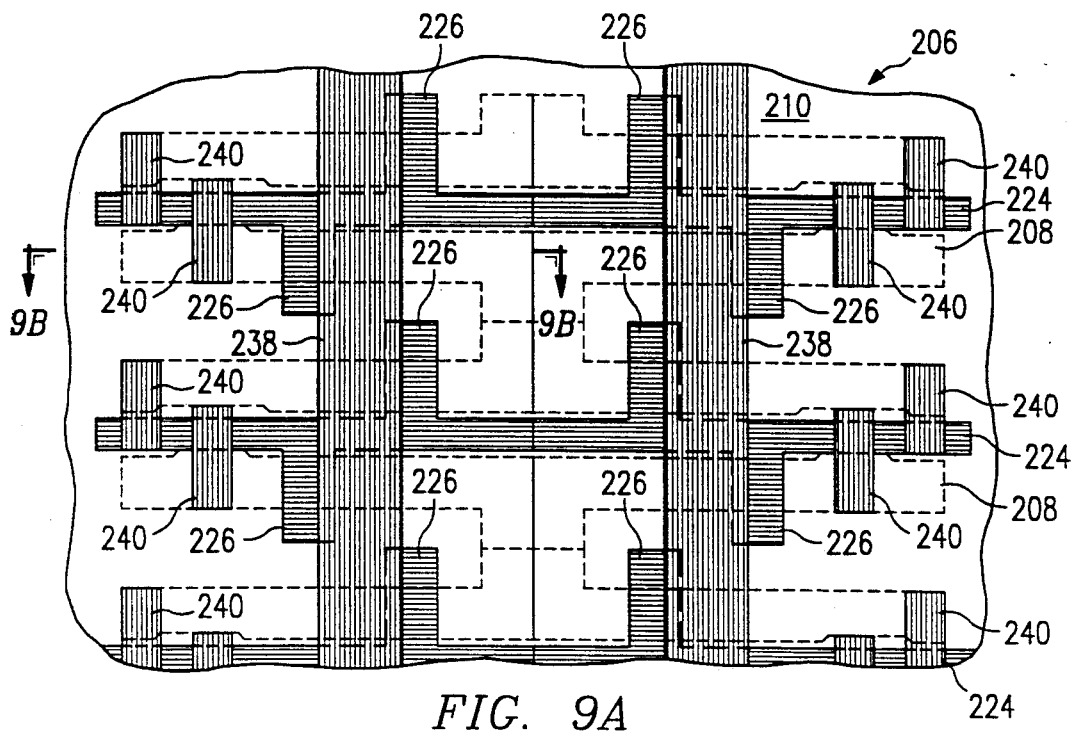
FIG. 9A illustrates the top view following the addition of orthogonal gate conductor regions.

An insulating layer 236 is formed over the entire structure illustrated in FIG. 8B and, therefore, forms over epitaxial semiconductor layer 216 and extends within trench 232. In the preferred embodiment, insulating layer 236 is formed by growing an oxide layer. Generally, the oxide layer is on the order of 250 angstroms in thickness; however, it should be noted that in regions where insulating layer 236 forms overlying heavily doped regions (e.g., over trench transistor source/drain region 230 and over buried diffused region contact 218) the thickness of insulating layer 236 will be significantly increased as illustrated in FIG. 8B. FIG. 9A illustrates a top view of array region 206 following the addition of second gate conductor regions 238 and trench transistor gate regions 240. From the perspective of FIG. 9A, it may be appreciated that second gate conductor regions 238 are orthogonal to first gate conductor regions 224. This overall orthogonal scheme permits the benefits and advantages discussed above in connection with FIGS. 4A through 5C. The particular fabrication of second gate conductor regions 238 and trench transistor gate regions 240 is discussed in greater detail below in reference to FIG. 9B.

Figure 9B:
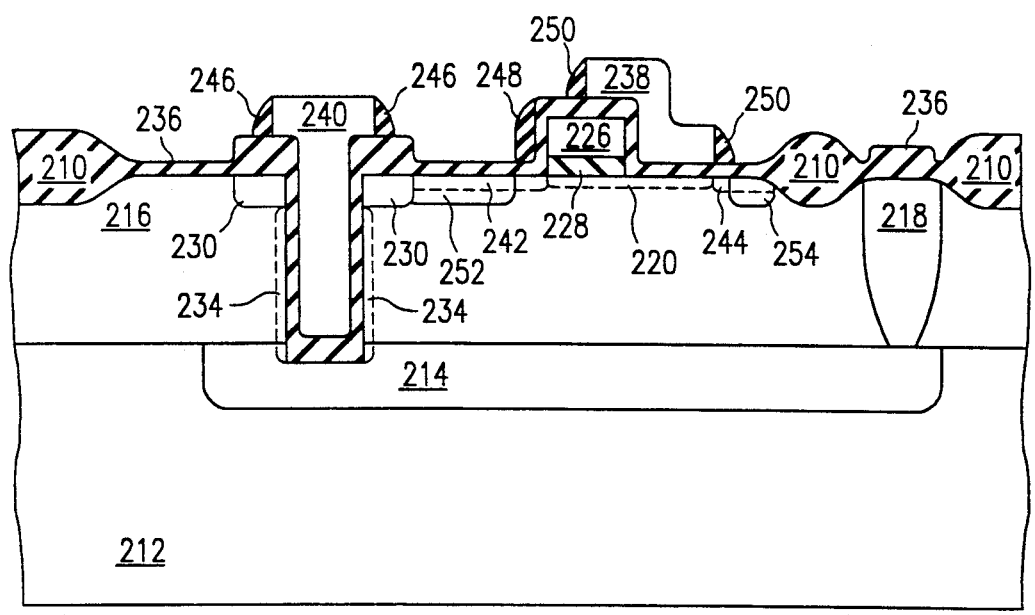
FIG. 9B illustrates a cross-sectional view of FIG. 9A, including a second gate conductor adjacent the first gate conductor and an additional trench gate conductor formed within the trench.

FIG. 9B illustrates a cross-sectional view of array 206 of FIG. 9A, including second gate conductor region 238 and trench transistor gate region 240. Second gate conductor region 238 and gate region 240 are formed in a simultaneous process as follows. A polysilicon layer on the order of 5500 angstroms in thickness is deposited over the entire structure of FIG. 8B. The polysilicon layer is patterned and etched in order to form polysilicon regions in the desired areas, and more particularly, to form second gate conductor region 238 adjacent gate conductor extension 226, and trench transistor gate region 240 within trench 232. After the formation of second gate conductor region 238 and trench transistor gate region 240, lightly doped drain (LDD) regions 242 and 244 may be formed in a self-aligned fashion to gate conductor extensions 226 and 238, respectively. Sidewall spacers 246, 248 and 250 are formed following the formation of gate conductor region 238 and gate region 240. In the preferred embodiment, sidewall spacers 246, 248 and 250 are formed by depositing an oxide layer on the order of 2000 angstroms in thickness over the entire structure, and anisotropically etching the layer to leave spacers 246, 248 and 250. Implanted source/drain regions 252 and 254 are preferably formed by a double implant process. This process includes implanting N+ dopants such as phosphorous at a dopant level on the order of $4E14/cm^2$, followed by implanting arsenic at a dopant level on the order of $5E15/cm^2$. Thereafter, an annealing process at a temperature of 900° C. for a duration of 30 minutes may be used in order to further drive the dopants used to form implanted source/drain regions 252 and 254. Implanted source/drain regions 252 and 254 are operable as opposing source/drain regions for the series-connected transistor pair. Thus, source/drain region 254 may be connected to a bitline (or inverted bitline) while source/drain region 252 is connected to both one source/drain of a cross-coupled transistor and the gate of the opposing cross-coupled transistor.

Figure 10A:
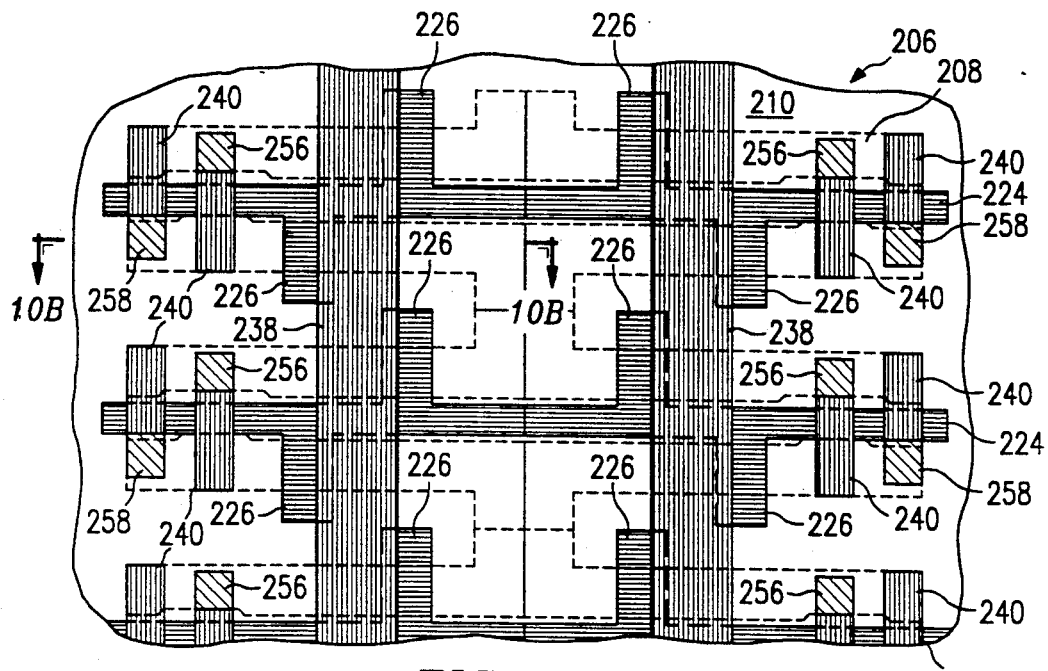
FIG. 10A illustrates the top view following the addition of local interconnect regions.

FIG. 10A illustrates a top view of array 206 following the formation of local interconnect regions 256 and 258. Local interconnect regions 256 and 258 provide the "parallel cross-coupling" effect described above in connection with FIGS. 6A and 6B. The formation of local interconnect regions 256 and 258 is described in greater detail below with respect to FIG. 10B.

Figure 10B:
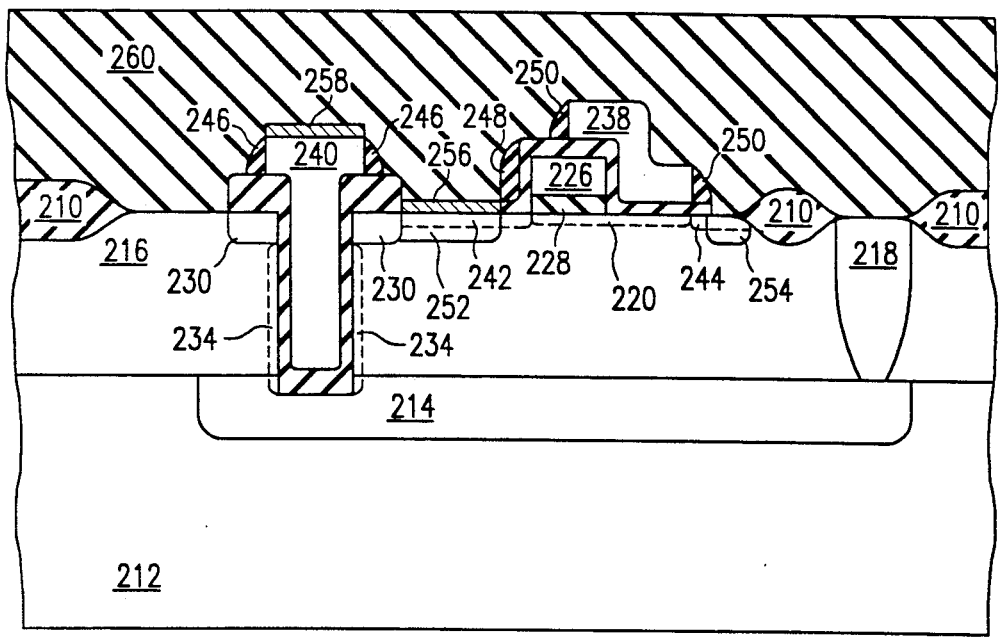
FIG. 10B illustrates a cross-sectional view of FIG. 10A, including the local interconnect regions.

FIG. 10B illustrates a cross-sectional view of array 206 of FIG. 10A. A deglaze step reduces the thicknesses of exposed oxides, and in particular, exposes implanted source/drain regions 252 so that electrical contact may be made thereto. Thereafter, a titanium layer (not shown) on the order of 1000 angstroms is deposited over the entire structure and reacted at a temperature on the order of 600° C. The reacted titanium is patterned and etched so that the exposed implanted source/drain region 252 may be connected in a parallel cross-connection to the trench transistor gate region of the trench transistor which is part of the other half of the cell not illustrated in FIG. 10B. The perspective of FIG. 10A illustrates this connection in that a first interconnect region 256 is shown to extend and make contact from a first moat area toward a local interconnect region 256 formed on the trench transistor gate in the opposing moat area. At the same time, and in opposite fashion, a second interconnect region 258, is formed parallel to the first interconnect region 256 and connects the gate region of the trench transistor in the second moat area to the source/drain of the trench transistor in the first moat area. Thus, the source/drain of one trench transistor is connected to the gate of the opposing trench transistor (not shown in FIG. 10B), thereby accomplishing the effective cross-coupling illustrated in FIG. 6B above. It should also be noted that a second anneal may be performed in order to lower the electrical resistance of local interconnect regions 256 and 258.

An insulating layer 260 is formed overlying the entire structure illustrated in FIG. 10B. In the preferred embodiment, insulating layer 260 comprises a deposited layer of oxide on the order of 8000 angstroms in thickness. After insulating layer 260 is deposited, it may be reflowed in order to promote a planar device structure.

Figure 11A:
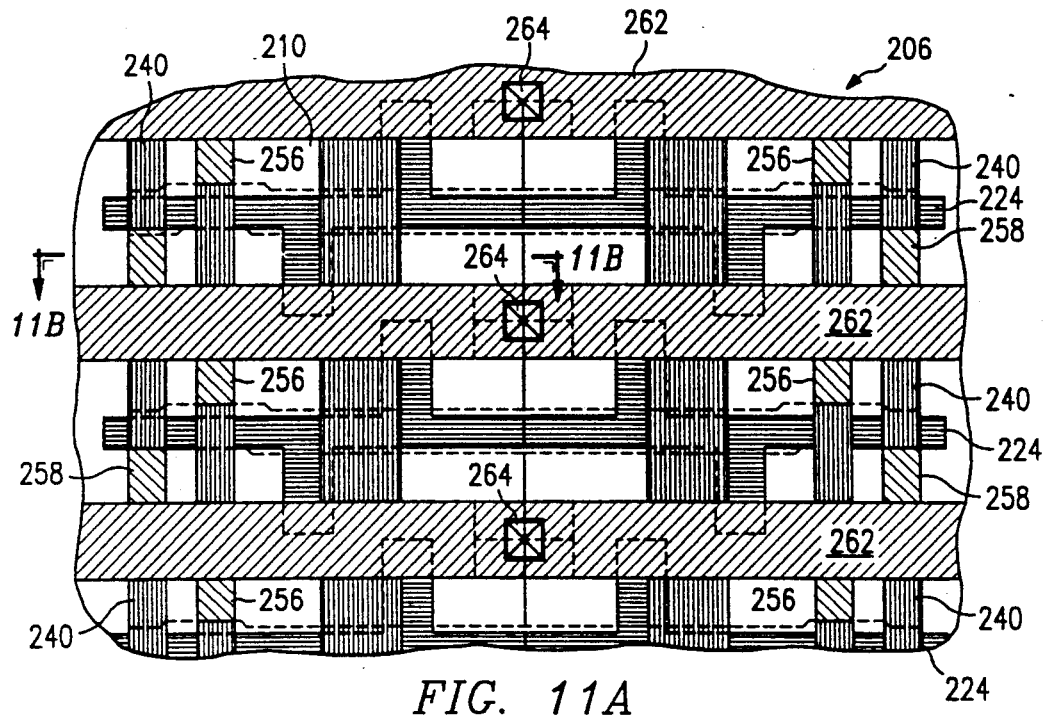
FIG. 11A illustrates the top view following the addition of bitlines and metal contacts.

FIG. 11A illustrates a top view of array 202 following the addition of bitlines 262 and contacts 264. Bitlines 262 provide the necessary connections as discussed above with reference to FIG. 3. Further, as was described in greater detail in FIGS. 5A through 5C, bitlines 262 are shared so that each cell only requires a total of one metal width (i.e. 2×½ metal width) per cell. The construction of bitlines 262 and contacts 264 is discussed below in connection with FIG. 11b.

Figure 11B:
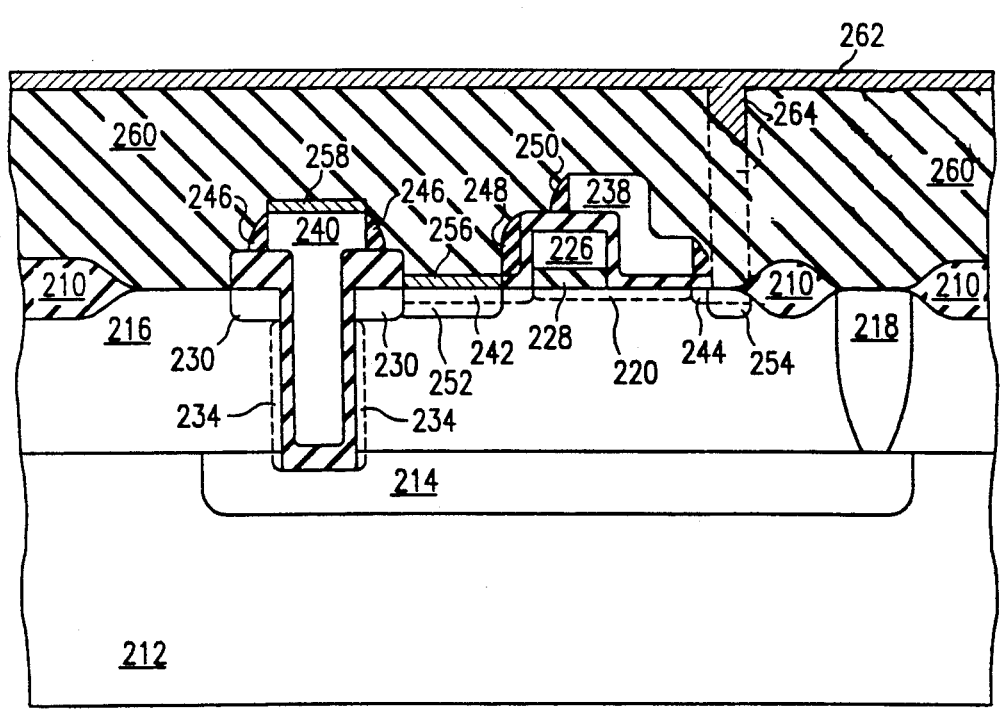
FIG. 11B illustrates a cross-sectional view of FIG. 11A, including the bitline and the contact shown in cut-away view because it is formed behind the cross-sectional location identified in FIG. 11A.

FIG. 11B illustrates a cross-sectional view of FIG. 11A including a bitline 262 and a contact 264. Contact 264 is shown in cutaway fashion because it is formed behind the 11B—11B cutaway line of FIG. 11A. Insulating layer 260 is patterned and etched so that a hole is formed through insulating layer 260 from its surface down to implanted source/drain region 254. Thereafter, a metal layer is deposited over the entire structure. The metal layer is patterned and etched to form bitline 262 and metal contact 264. From the perspective illustrated in FIG. 11B, it may be appreciated that bitline 262 and metal contact 264 are actually one contiguous piece of metal, but are denoted with two separate reference numerals for purposes of explanation. Further, from a review of FIG. 3, it may be appreciated that contact 264 represents a connection of either bitline 140 or inverted bitline 158 to a first source/drain (i.e. either 146 or 164) of the first in the series pair of transistors.

It should be noted that additional connections shown in FIG. 3 need not be made on a per cell basis and, therefore, are not illustrated in FIG. 11B. Nonetheless, as understood in the art, gate conductor regions 226 and 238 extend across the array, and may be contacted at various points thereof. Further, buried diffused region 214 operates as a second source/drain (as opposed to source/drain 230) to the trench transistor. Accordingly, this region may be contacted by making contact to contact 218, also in a manner as known in the art.

From a review of FIGS. 7A through 11B, it may be appreciated that only orthogonal geometries are preferably implemented with the present invention. Accordingly, there are no slants (i.e., 45 degree angles), turns or the like which would otherwise require valuable additional surface area. As a result, the packaging density of cells constructed in accordance with the present invention is dramatically increased.

While the present invention has been described in detail, it should be understood that various substitutions, alterations and changes may be made hereto without departing from the spirit and scope of the invention as defined by the appended claims. For example, various intermediary connections may be made to the devices described above without affecting the inventive structure. Thus, a first-structure may be "coupled" through an intermediate structure to a second structure rather than being directly "connected" as illustrated above. As an additional example, various substitutions in materials may be made by one skilled in the art, but which would not depart from the invention defined by the following claims.

What is claimed is:

1. A memory array comprising:
   a plurality of cells, wherein each cell is operable in two modes wherein the first mode comprises a storage mode and wherein the second mode comprises an access mode in which binary information is either read from or written to a memory cell, each of said plurality of cells comprises:
      a first series-coupled pair of transistors;
      a second series-coupled pair of transistors; and
      a pair of cross-coupled transistors coupled between said first and second pair of series-coupled transistors and
      wherein each of the two modes is effected through the combination of a first and second clocking signals;
   a first conductive wordline is operable to transmit the first clocking signal from a control circuitry to a first control electrode of said first and second series-coupled pair of transistors; and
   a second conductive wordline is operable to transmit the second clocking signal from said control circuitry to a second control electrode of said first and second series-coupled pair of transistors; and
   wherein in the storage mode each series-coupled pair of transistors operate as respective switched capacitive configuration and wherein the first series-coupled pair of transistors between the cross-coupled transistors and a bitline, and the second series-coupled pair of transistors between the cross-coupled transistors and an inverted bitline provide an equivalent resistance; and wherein in the access mode each of said first and second series-coupled pair of transistors act as pass transistors for reading or writing data provided on said bitline and inverted bitline.

2. The memory array of claim 1 wherein said first conductive wordline comprises orthogonal extensions, wherein said orthogonal extensions lie substantially parallel to said second conductive wordline.

3. The memory array of claim 1 wherein each of said cross-coupled transistors comprises a trench transistor.

4. The memory array of claim 1 wherein the first and second clocking signals comprise non-overlapping clocking signals during the first mode, and wherein the first and second clocking signals comprise a high signal during the second mode.

5. A memory array including a plurality of cells arranged generally in a row by column format, comprising:
- a plurality of cells, wherein each cell is operable in two modes, wherein the first mode comprises a storage mode and the second mode comprises an access mode and wherein each of the two modes is effected through the combination of a first and second clocking signals, and wherein each of said cells comprises:
- a first series-connected pair of transistors;
- a second series-connected pair of transistors; and
- a pair of cross-coupled transistors coupled between said first and second pair of series-connected transistors;
- a first conductive wordline is operable to transmit the first clocking signal from a control circuitry to a first control gate of the first and second series-connected pair of transistors; and
- a second conductive wordline is substantially orthogonal to said first conductive wordline, and operable to transmit the second clocking signal from said control circuitry to a second control gate of said first and second series-connected pair of transistors; and wherein in the storage mode each series-coupled pair of transistors operate as respective switched capacitive configuration wherein the first series-coupled pair of transistors between the cross-coupled transistors and a bitline, and the second series-coupled pair of transistors between the cross-coupled transistors and an inverted bitline provide an equivalent resistance; and wherein in the access mode each of said first and second series-coupled pair of transistors act as pass transistors for reading or writing data provided on said bitline and inverted bitline.

6. The memory array of claim 5 wherein said pair of cross-coupled transistors comprises a first and second transistor, and wherein each of said first and second transistors comprise:
- a source/drain; and
- a gate conductor;
- wherein said gate conductor of said first transistor is connected by a first connection to said source/drain of said second transistor, and wherein said gate conductor of said second transistor is connected by a second connection to said source/drain of said first transistor.

7. The memory array of claim 6 wherein said first and second connections are substantially parallel to one another.

8. The memory array of claim 6 wherein said gate conductor of said first transistor is coplanar and partially overlies said gate conductor of said second transistor.

9. The memory array of claim 5 wherein each of said cross-coupled transistors comprises a trench transistor.

10. The memory array of claim 5 and further comprising:
- a first predetermined number of conductive lines parallel to said first conductive lines and operable to transmit the first signal; and
- a second predetermined number of conductive lines parallel to said second conductive lines and operable to transmit the second signal.

11. The memory array of claim 10 wherein the first predetermined number equals the number of rows in the array minus one, and wherein the second predetermined number equals the number of columns in the array minus one.

12. The memory array of claim 1 wherein said first conductive wordline line is substantially orthogonal to said second conductive wordline.

* * * * *